(12) United States Patent
Ichikawa

(10) Patent No.: US 6,327,442 B1
(45) Date of Patent: Dec. 4, 2001

(54) CIRCUIT BOARD FOR CAMERA

(75) Inventor: Yuichi Ichikawa, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/366,764

(22) Filed: Aug. 4, 1999

(30) Foreign Application Priority Data

Aug. 4, 1998 (JP) .................................................. 10-232274

(51) Int. Cl.[7] .............................. G03B 17/00; H05K 1/00
(52) U.S. Cl. ........................................... 396/542; 361/749
(58) Field of Search .................................... 396/542, 535, 396/539, 541; 361/748, 749, 760; 174/52.1

(56) References Cited

U.S. PATENT DOCUMENTS

| | | | |
|---|---|---|---|
| 4,711,548 | * | 12/1987 | Arakawa et al. .................... 396/542 |
| 4,853,734 | * | 8/1989 | Tokura et al. ....................... 396/542 |
| 5,079,577 | | 1/1992 | Nomura . |
| 5,181,065 | * | 1/1993 | Hara .................................... 396/542 |
| 5,398,163 | | 3/1995 | Sano . |
| 5,521,670 | * | 5/1996 | Hara et al. ........................... 396/542 |
| 5,528,336 | * | 6/1996 | Inoue .................................. 396/542 |

\* cited by examiner

Primary Examiner—Russell Adams
Assistant Examiner—Kenneth J Whittington
(74) Attorney, Agent, or Firm—Greenblum & Bernstein, P.L.C.

(57) ABSTRACT

A circuit board is to be provided on outer surfaces of an internal camera body having a containing section to hold an element of a camera. The containing section has an opening on one of the outer surfaces of the internal camera body. The circuit board has a bendable portion that allows the circuit board to bend thereat; and a leaf portion that is connected to the remaining part of the circuit board only with the bendable portion. The leaf portion covers the containing section when the leaf portion is not bent at the bendable portion, and is located to expose the containing section to outside when the leaf portion is bent at the bendable portion.

11 Claims, 4 Drawing Sheets

US 6,327,442 B1

CIRCUIT BOARD FOR CAMERA

BACKGROUND OF THE INVENTION

The present invention relates to a circuit board for a camera.

A camera has several optical systems that comprise optical elements such as lenses, mirrors, prisms, and filters. When the camera has been used for a long time, dust may likely enter inside the camera, and adhere to optical elements. In such a case, quality of an image formed by the optical system may be deteriorated. Thus, if dust adheres to the optical elements, the optical elements must be taken out of the camera and cleaned. When the optical elements are damaged and to be replaced, they must also be taken out of the camera.

FIG. 4 is a perspective view showing an example of a conventional camera of which the body cover (not shown) is removed. It should be noted that a camera includes an internal body 11 and a body cover. The body cover covers an internal body 11 on which a printed circuit board is provided.

As shown in FIG. 4, upper and the side surfaces of the internal body 11 is covered with a circuit board 12. On the circuit board 12, electronic circuits are formed (printed) to control various systems such as the shutter, the aperture, the focusing mechanism, and the like. As components of the circuits, button-type switches 21, a semiconductor chip 101, and the like are provided on the circuit board 12.

In the conventional camera, when an optical element provided inside the internal body 11 is to be replaced, the circuit board 12 must be removed from the internal body 11. If an optical element is to be taken out from an upper surface of the internal body 11, at least a portion of the circuit board 12 covering the upper surface should be completely removed. In addition, to remove the circuit board 12, the wires between the circuit board 12 and the internal body 11 may be disconnected. Further, after the optical element is taken out and cleaned, or a new optical element is placed inside the internal body 11, the wires once disconnected must be restored to their original status. Thus, work required to take out the optical element from the internal body 11 is very bothersome. Furthermore, if the camera is constructed such that the circuit board 12 is fixed to the internal body 11 with screws, when the circuit board 12 is removed, unfastened screws may be lost.

SUMMARY OF THE INVENTION

It is therefore an object of the present invention to provide an improved circuit board which enables elements in the internal body to be taken out therefrom easily.

For the above object, according to the present invention, there is provided a circuit board provided on outer surfaces of an internal camera body having a containing section to hold an element of a camera, the containing section having an opening on one of the outer surfaces of the internal camera body, the circuit board comprising: a bendable portion that allows the circuit board to bend thereat; and a leaf portion that is corrected to the remaining part of the circuit board only with the bendable portion, the leaf portion covering the containing section when the leaf portion is not bent at the bendable portion, the leaf portion being located to expose the containing section to outside when the leaf portion is bent at the bendable portion.

Since the leaf portion can be located away from the internal camera body without removing the entire circuit board, it is less bothersome to remove or replace the element(s) held in the containing section.

Optionally, the circuit board covers substantially an entire area of the one of the outer surfaces on which the opening is formed, wherein at least one slit is formed on the circuit board to define the leaf portion.

Thus, it is not necessary to reduce the area of the circuit board, and the operability in removing or replacing the element contained in the containing section is improved.

In a particular case, at least the bendable portion is formed of a flexible circuit board. In other words, even it the entire circuit board is formed of rigid material, by forming the bendable portions with the flexible circuit board, the element held in the containing section can easily be removed/ replaced, and further electrical connection can be maintained.

In a particular case, the element of the camera held in the containing section could be an optical element. For example, the optical element can be a focusing block of a finder optical system of the camera.

optionally, the bendable portion is formed to extend, from one side end of the circuit board, in a predetermined direction, and wherein the at least one slit is formed, from another side end next to the one side end, to extend in a direction perpendicular to the bendable portion.

The bendable portion maybe arranged to extend parallel with an optical axis of a photographing optical system of the camera. Alternatively, the bendable portion may be arranged to extend in a direction perpendicular to an optical axis of a photographing optical system of said camera.

Optionally, one electronic component may be provided on the leaf portion and is connected to another electronic component located, on the circuit board, at a portion other than the leaf portion.

According to another aspect of the invention, there is provided a camera, which is provided with: an internal camera body having outer surfaces on which a circuit board is provided, the camera having a containing section to hold an element of a camera, the containing section having an opening on one of the outer surfaces of the internal camera body. In this case, the circuit board may have: a bendable portion that allows the circuit board to bend thereat; and a leaf portion that is connected to the remaining part of the circuit board only with the bendable portion, the leaf portion covering the containing section when the leaf portion is not bent at the bendable portion, the leaf portion being located to expose the containing section to outside when the leaf portion is bent at the bendable portion.

According to a further aspect of the invention, there is provided a circuit board provided on outer surfaces of an internal camera body having a containing section to hold an element of a camera, the containing section having an opening on one of the outer surfaces of the internal camera body. The circuit board is provided with: an unremovable portion which is unremovable from the internal camera body; and a removable portion that is formed to be bendable so as to be removed from the internal camera body without being electrically disconnected from the unremovable portion, the removable portion covering the containing section when the removable portion is not bent, the removable portion being located away from the internal camera body so as to expose the containing section to outside when the leaf portion is bent.

DESCRIPTION OF THE EMBODIMENTS

The invention will be described with reference to the accompanying drawings.

[First Embodiment]

Figure 1:
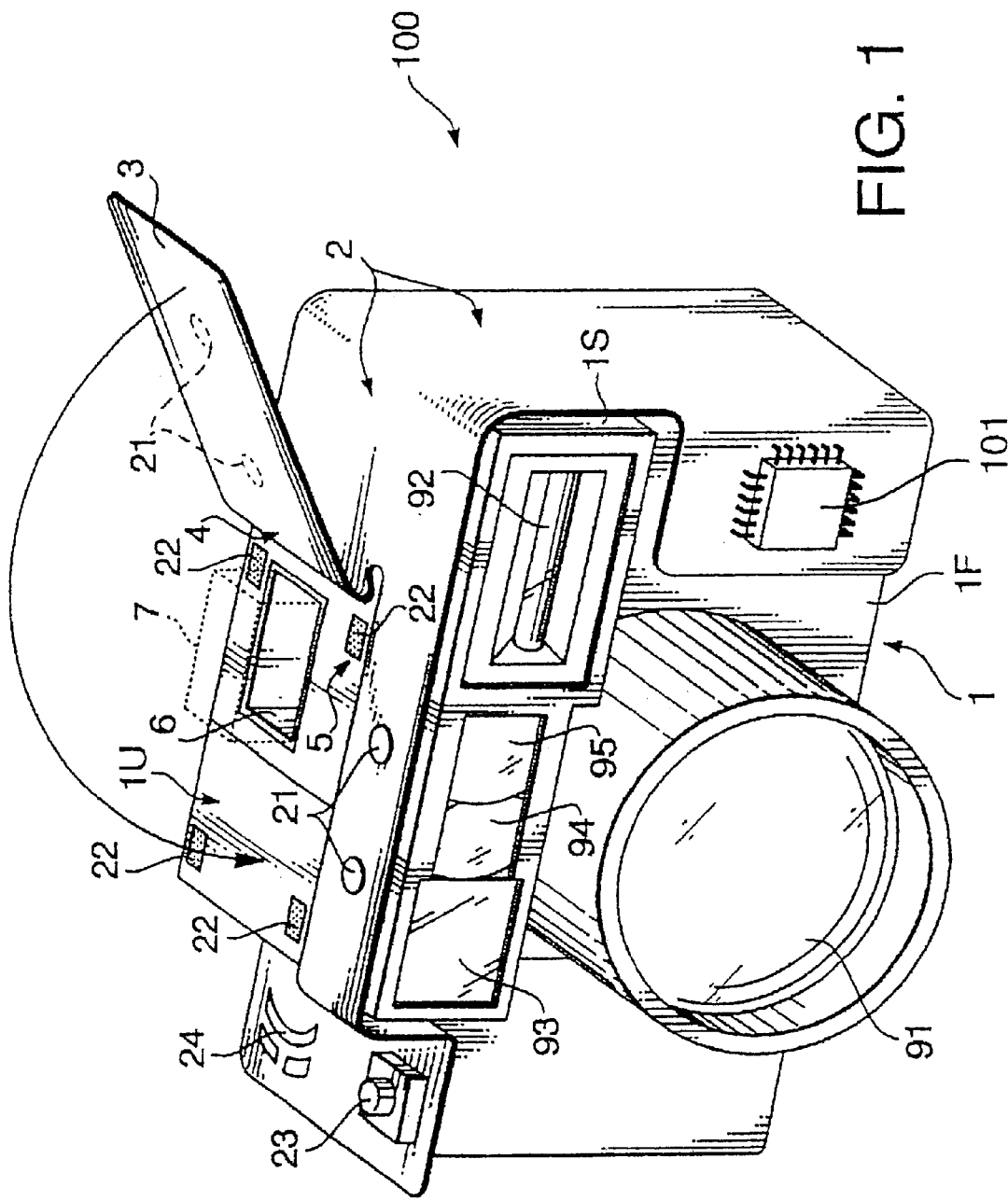
FIG. 1 is a perspective view showing a camera according to a first embodiment of the present invention of which a body cover is removed.

FIG. 1 is a perspective view showing a camera 100 according a first embodiment of the present invention with body cover (not shown) being removed.

On a front surface 1F of the internal body 1, a photographing lens 91, a strobe 92, a finder window 93, a distance measuring system window 94, and a photometry system window 95 are provided.

The photographing lens 91 forms images of an object on a film loaded in the internal body 1.

The strobe 92 emits light when the operating mode is set in a mode allowing the strobe 92 to emit light when the brightness of an object is insufficient.

The finder window 93 is an entrance window of a finder optical system of the camera 100.

The distance measuring system window 94 is the entrance window of the distance measuring system that calculates distance from the camera to an object in accordance with, for example, a correlation method utilizing light received through the window 94. The focusing mechanism (not shown) is driven based on information from the distance measuring system so that the photographing lens 91 forms proper images on the film.

The photometry system window 95 is the entrance window of the photometry system that measures brightness of an object in accordance with the light received through the window 95. Exposure parameters, i.e., shutter speed and aperture value are determined based on the measured brightness of the object.

On an upper surface 1U of the internal body 1, a block containing section 6 is formed, in which a focusing block 7 (which will be described below) is accommodated.

The focusing block 7 includes a focusing plate 72 on which an image of an object is formed, and a pair of cover glass 71 for preventing invasion of dust particles inside the block 7.

Figure 2A:
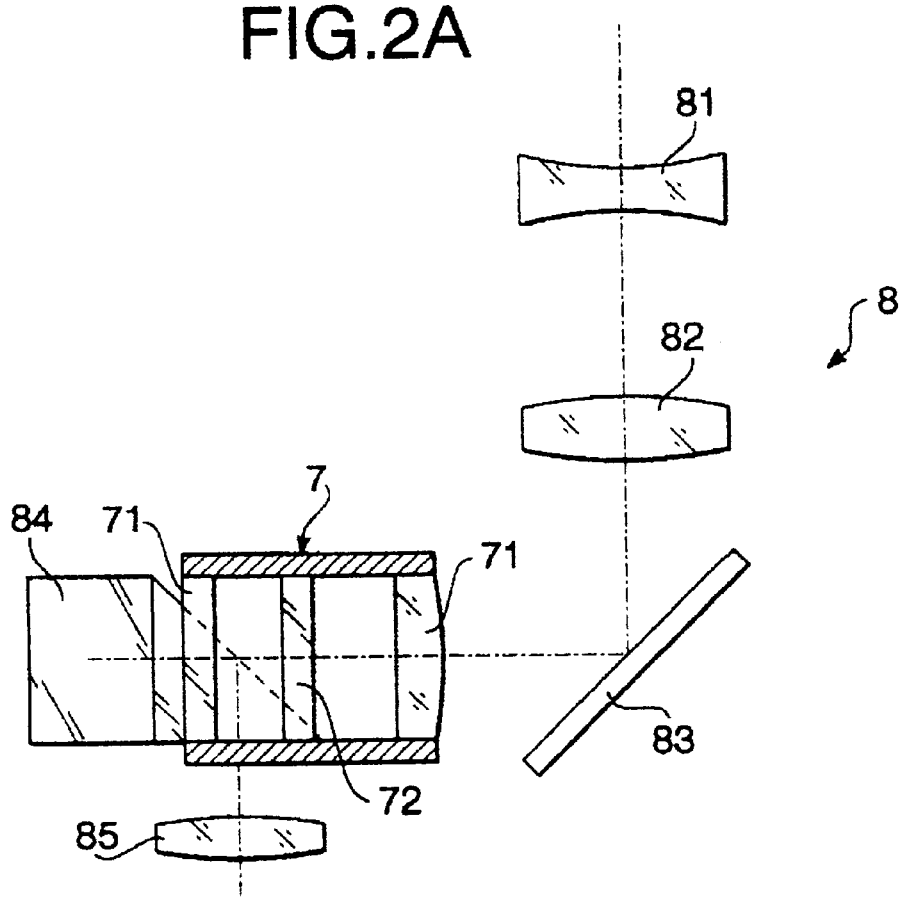
FIG. 2A is a plan showing a constitution of a finder optical system.
Figure 2B:
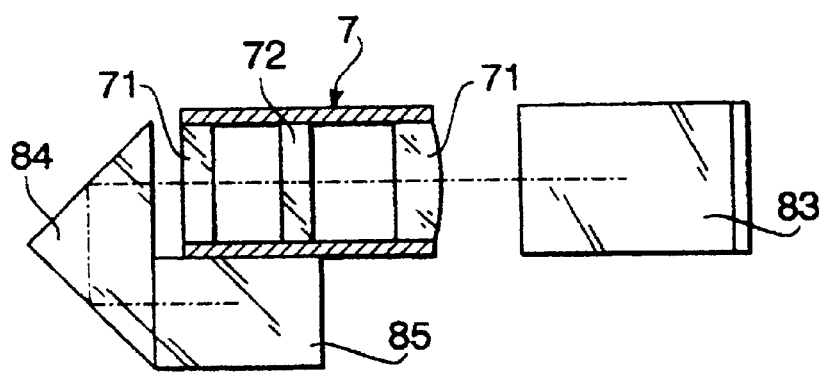
FIG. 2B is a rear view showing a constitution of a finder optical system.

FIG. 2A is a plan view, and FIG. 2B is a rear view showing a constitution of a finder optical system 8 of the camera 100. The finder optical system 8 is built in the upper portion of the internal body 1.

The finder optical system 8 includes a first objective lens 81, a second objective lens 82, a mirror 83, the focusing block 7, a prism 84, and an eyepiece 85.

The light entered through the finder window 93 passes through the first and second objective lenses 81 and 82, is reflected by the mirror 83, and forms an image on the focusing plate 72. An operator can observe the image formed on the focusing plate 72 through the eyepiece 85, via the prism 84.

If dust particles adhere onto the focusing plate 72, the image of adhered dust particles becomes conspicuous in an image viewed through the eyepiece 85. Therefore, in case dust particles are adhered onto the focusing plate 72, it should be taken out from the internal body 1 and cleaned.

The circuit board 2 covers, as shown in FIG. 1, the upper surface 1U and a side surface 1S, and part of the front surface 1F of the internal body 1. On the circuit board 2, electronic circuits are formed to connect various electrical elements inside the internal body 1. For example, a shutter driving mechanism, an aperture driving mechanism, the focusing mechanism, and the like are connected to electrical circuits. The circuit board 2 is a flexible circuit board that can be easily bent at a desired portion.

On the circuit board 2, a plurality of button-type switches 21, a semiconductor chip (a CPU) 101, a two-step switch 23, and contacts 24 for the exposure control knob provided on the body cover are provided.

The button-type switches 21 are switches built in the circuit board 2. The button-type switches 21 are arranged to face corresponding mode buttons provided or. the body cover (not shown) when the internal body 1 is covered with the body cover. With this construction, when a mode button of the body cover is depressed, the corresponding button-type switch 21 is closed. The mode buttons are used to change operation modes of the camera. The button-type switches 21 are connected to the CPU 101 with the circuit board 2.

The CPU 101 controls various operations of the camera including feeding of the film, shutter release operation, driving of the focusing mechanism, and the like.

The two-step switch 23 includes two different switches: a first switch is closed when the two-step switch 23 is half-depressed; and the other is closed when the two-stepswitch 23 is fully depressed. The two-step switch 23 is arranged to face a release button provided on the body cover when the internal body 1 is covered with the body cover. Accordingly, by depressing the release button halfway, only the first switch is closed, and by fully depressing the release button, both the first and second switches are closed.

The contacts 24 correspond to the exposure control knob provided on the body cover. The contacts 24 are arranged to contact brushes of the exposure control knob provided on the body cover when the internal body 1 is covered with the body cover. The exposure control knob is used to select exposure conditions when a manual exposure mode is selected with the mode button. The position of the exposure control knob is detected based on the signal from the contacts 24.

The two-step switch 23 and the contacts 24 are connected to the CPU 101 with electronic circuits formed on the circuit board 2.

As shown in FIG. 1, a slit 5 is formed on the circuit board 2 so that the circuit board 2 is bent at a bendable portion 4. In this embodiment the bendable portion extends in a direction substantially parallel to the optical axis of the photographing lens 9, and the slit 5 extends in a direction substantially perpendicular to the bendable portion 4.

By the slit 5 and the bendable portion 4, a leaf portion 3 is defined. The leaf portion 3 can be turned about the bendable portion 4. The leaf portion 3 functions as an openable cover of the containing section 6.

The leaf portion 3 is detachably secured onto the upper surface 1U of the internal body 1 with a plurality of double-sided tapes 22 provided on the upper surface 1U of the internal body 1. In other words, the leaf portion 3 is a removable portion which can be located away from the upper surface 1U, while the remaining part of the circuit board 2 is an unremovable portion which is fixed onto the surfaces of the internal body.

It should be noted that the leaf portion 3 is a part of the circuit board 2 and bears electronic circuits and/or lines. the bendable portion 4 also bears electronic circuits and/or lines.

The button-type switches 21 provided on the leaf portion 3 are electrically connected to the CPU 101 via circuits/lines on the leaf portion 3 and the bendable portion 4 as well as on the remaining part of the circuit board 2.

The circuit board 2 is formed to be bent easily at the bendable portion 4 while maintaining electrical connection between the circuits on the leaf portion 3 and the circuits on the remaining part of the circuit board 2.

The containing section 6 is a recess formed on the upper surface 1U of the internal body 1. The position on the upper surface 1U of the containing section 6 corresponds to the leaf portion 3. That is, when the leaf portion 3 is placed on the upper surface 1F, the containing section 6 is covered with the leaf portion 3. The containing section 6 holds the focusing block 7 of the finder optical system 8. The focusing block 7 is detachably fixed to containing section 6 with, for example, screws (not shown).

In the camera according to the present invention, it is easy to take out the focusing block 7 from the internal body 1. To take out the focusing block 7, firstly, the body cover is removed, and the leaf portion 3 is lifted (i.e., the circuit board 2 is bent at the bendable portion 4). Then, the fixing screws of the focusing block 7 are loosened and removed, and the focusing block 7 is taken out by using a pair of tweezers or by turning the internal body 1 upside down. Thus, the entire circuit board 2 does not have to be removed from the internal body 1, and accordingly, the procedure is much simpler and less bothersome than that of the conventional camera.

Furthermore, according to the embodiment, the area of the circuit board 2 does not have to be reduced to provide an access opening for removing the focusing block 7.

[Second Embodiment]

Figure 3:
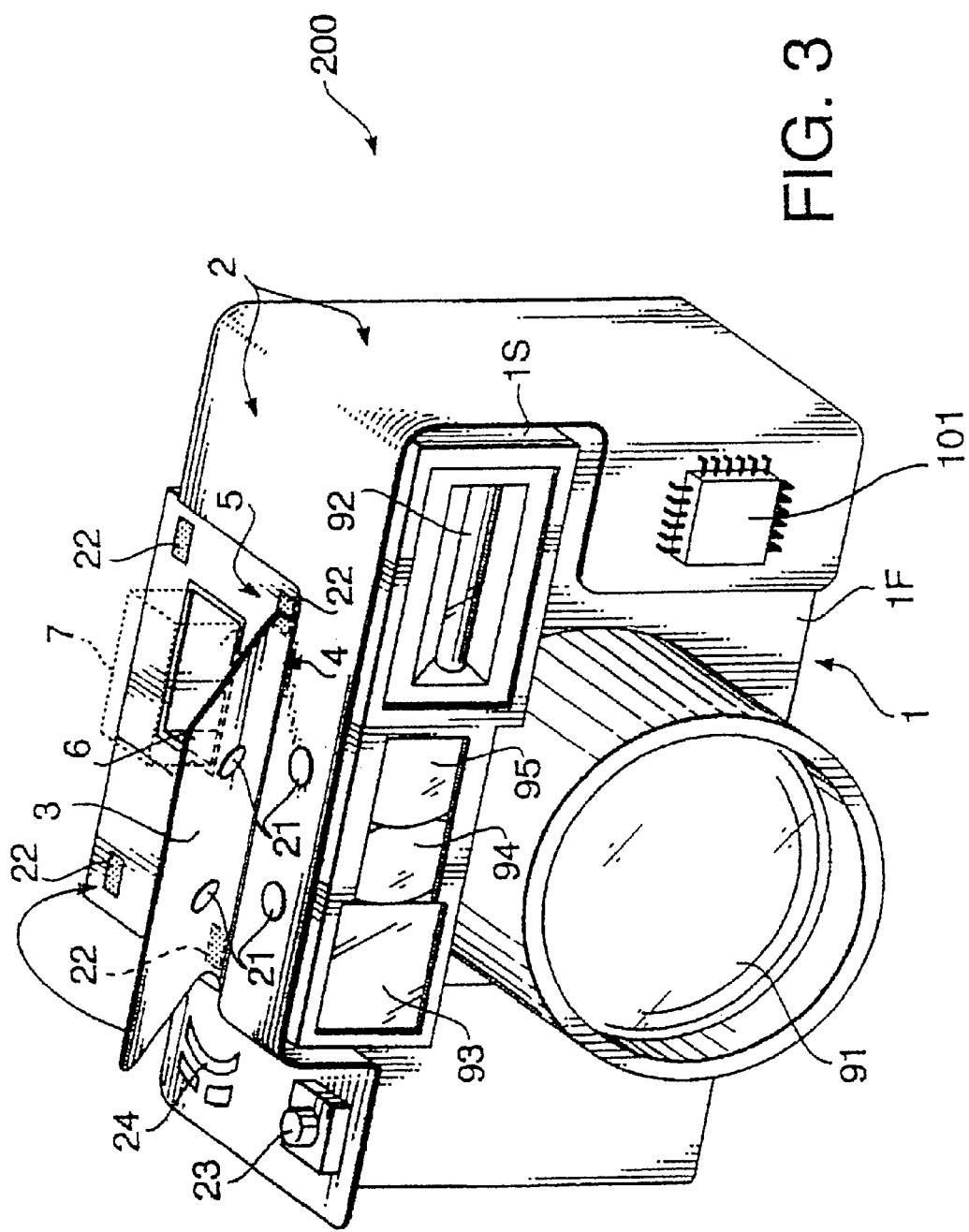
FIG. 3 is a perspective view showing a camera according to a second embodiment of the present invention of which a body cover is removed.
Figure 4:
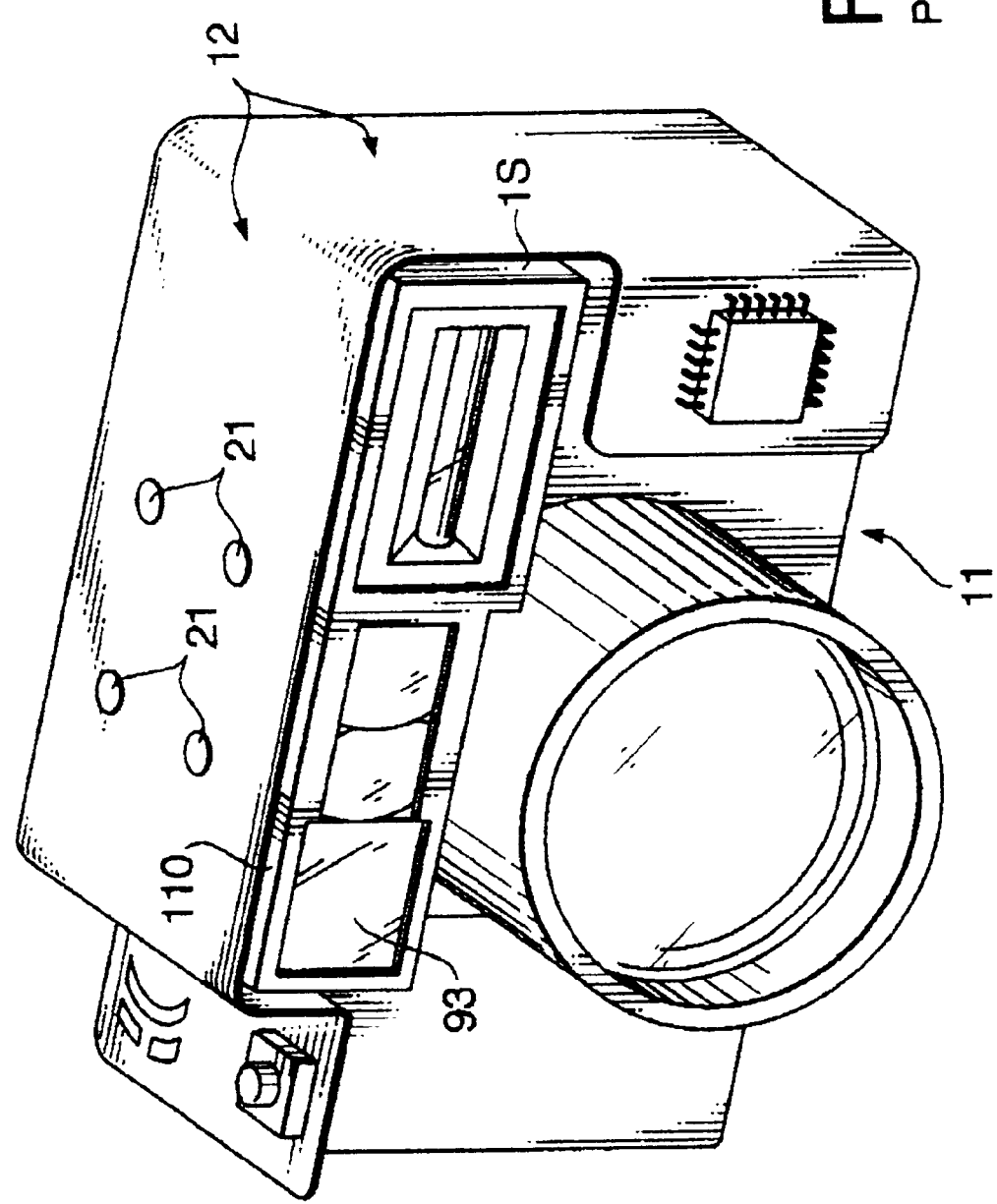
FIG. 4 is a perspective view showing a conventional camera of which a body cover is removed.

FIG. 3 is a perspective view showing a camera 200 according to a second embodiment of the invention.

In this embodiment, the bendable portion 4 is arranged to extend in a direction substantially perpendicular to the optical axis of the photographing lens 91, and the slit 5 is formed to extend in a direction parallel to the optical axis of the photographing lens 91. The other features of this embodiment are the same as those of the first embodiment.

This embodiment has the same advantageous effects as those of the first embodiment.

It should be noted that, in this invention, to define the flip portion is important, and For that purpose, the number of slits need not be limited to one, and the slit(s) and the bendable portion 4 may be arranged to extend in any direction.

Of course, if the leaf portion 3 can be formed without forming the slit, the slit 5 needs not be formed.

Although the invention has been described in its preferred forms, it is understood that the present disclosure of the preferred forms can be changed in the details of construction and alternative combinations of parts may be resorted to without departing from the spirit and the scope of the invention.

The bendable portion 4 may be made of other materials that can be easily bent while maintaining electrical connection between the circuits on the leaf portion 3 and the remaining portions of the circuit board 2.

Although it is not necessary to limit the thickness of the circuit board 2, the preferable thickness of the circuit board 2 may range from 0.2 mm to 5 mm, and more preferably, the thickness of the circuit board 2 may range from 0.5 mm to 3 mm.

The preferable length of the bendable portion on 4 may range from 5 mm to 50 mm, although it is not limited within this range. More preferably, it may range from 15 mm to 30 mm considering the sizes of other parts of the camera.

The preferable length of the slit 5 may range from 5 mm to 50 mm, considering the size of the containing section 6, although it is not limited within this range. More preferably, it may range from 15 mm to 40 mm.

Optionally, to fix the leaf portion 3 to the internal body 1, screws, fasteners, and any other means that meets the purpose may be employed.

The leaf portion 3 and the containing section 6 may be arranged in any portion of the camera such as on the front surface, the side surface, and the rear surface.

The members of the camera held in the containing space 6 are not limited to the focusing block 7. That is, a member of the distance measuring system, a member of the photometry system, or a strobe block may be held in the containing section 6.

It should be noted that, in the embodiments, the circuit board 2 is explained as a flexible circuit board. However, the circuit board could be formed of rigid material. It the bendable portion 4 is formed of the flexible circuit board, even if the leaf portion is rigid, it can be moved away from the internal camera body without removing the entire circuit board and without being electrically disconnected from the remaining part of the circuit board.

The present disclosure relates to the subject matter contained in Japanese Patent Application No. HEI 10-232274, filed on Aug. 4, 1998, which is expressly incorporated herein by reference in its entirety.

What is claimed is:

1. A circuit board provided on outer surfaces of an internal camera body having a containing section to hold an element of a camera, said containing section having an opening on one of said outer surfaces of said internal camera body, said circuit board comprising:

a bendable portion that allows said circuit board to bend thereat; and a leaf portion that is connected, solely through said bendable portion, to a remaining portion of said circuit board, said leaf portion being movable relative to said remaining portion by bending of said bendable portion between a first position in which the bendable portion is in a non-bent condition and the leaf portion is in a planar orientation relative to the remaining portion, in such that the leaf portion covers the opening of the containing section, and a second position in which the bendable portion is in a bent condition and the leaf portion is in a pivoted condition relative to the remaining portion, such that the leaf portion does not cover the opening of the containing section, thereby allowing access to an element within the containing section.

2. The circuit board according to claim 1, wherein said circuit board covers substantially an entire area of said one of said outer surfaces on which said opening is formed, wherein at least one slit is formed on said circuit board to define said leaf portion.

3. The circuit board according to claim 1, wherein at least said bendable portion is formed of a flexible circuit board.

4. The circuit board according to claim 1, wherein said element of the camera held in said containing section comprises an optical element.

5. The circuit board according to claim 4, wherein said optical element comprises a focusing block of a finder optical system.

6. The circuit board according to claim 2, wherein said bendable portion extends in a predetermined direction from one side end of said circuit board, and wherein said at least one slit extends in a direction transverse to said bendable portion from another side end of said circuit board which is adjacent to said one side end.

7. The circuit board according to claim 1, wherein said bendable portion extends in a direction substantially parallel to an optical axis of a photographing optical system of said camera.

8. The circuit board according to claim 1, wherein said bendable portion extends in a direction substantially perpendicular to an optical axis of a photographing optical system of said camera.

9. The circuit board according to claim 1, wherein at least one electronic component is provided on said leaf portion and is connected to another electronic component located on said remaining portion of said circuit board.

10. A camera, comprising:

an internal camera body having outer surfaces on which a circuit board is provided, said camera having a containing section to hold an element of a camera, said containing section having an opening on one of said outer surfaces of said internal camera body, said circuit board having:

a bendable portion that allows said circuit board to bend thereat; and a leaf portion that is connected, solely through said bendable portion, to a remaining portion of said circuit board, said leaf portion being movable relative to said remaining portion by bending of said bendable portion between a first position in which the bendable portion is in a non-bent condition and the leaf portion is in a planar orientation relative to the remaining portion, such that the leaf portion covers the opening of the containing section, and a second position in which the bendable portion is in a bent condition and the leaf portion is in a pivoted condition relative to the remaining portion, such that the leaf portion does not cover the opening of the containing section, thereby allowing access to an element within the containing section.

11. A circuit board provided on outer surfaces of an internal camera body having a containing section to hold an element of a camera, said containing section having an opening on one of said outer surfaces of said internal camera body, said circuit board comprising:

an unremovable portion which is unremovable from the outer surfaces of said internal camera body; and a partially removable portion that is formed to be bendable relative to said unremovable portion so as to be partially removed from said one of said outer surfaces of said internal camera body without being electrically disconnected from said unremovable portion, said partially removable portion covering the opening of said containing section when said partially removable portion is not bent relative to said unremovable portion, said partially removable portion being spaced from said one of said outer surfaces of said internal camera body so as to expose the opening of said containing section to outside when said partially removable portion is bent relative to said unremovable portion.

* * * * *